(12) United States Patent
Tomiyama

(10) Patent No.: US 6,242,981 B1
(45) Date of Patent: Jun. 5, 2001

(54) AGC CIRCUIT

(75) Inventor: Hitoshi Tomiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/440,894

(22) Filed: Nov. 16, 1999

(30) Foreign Application Priority Data

Nov. 17, 1998 (JP) .................................................. 10-326495

(51) Int. Cl.[7] ..................................................... H03F 3/45
(52) U.S. Cl. ........................... 330/254; 330/141; 330/281
(58) Field of Search ..................................... 330/254, 141, 330/281

(56) References Cited

U.S. PATENT DOCUMENTS

| | | | |
|---|---|---|---|
| 3,805,177 | 4/1974 | Risley | 330/29 |
| 4,884,141 | 11/1989 | Hyakutake | 358/174 |
| 5,548,833 | 8/1996 | Towsend | 455/234.1 |
| 5,697,074 | * 12/1997 | Makikallio et al. | 455/126 |

FOREIGN PATENT DOCUMENTS 60-20610  * 2/1985  (JP) ..................................... 330/254

* cited by examiner

Primary Examiner—Michael B Shingleton
(74) Attorney, Agent, or Firm—Jay H. Maioli

(57) ABSTRACT

To make variable time constant of an AGC loop of an AGC circuit, there is provided an AGC circuit including a control circuit for controlling a level of an input signal and outputting an output signal, a rectifying circuit for rectifying the output signal from the control circuit and outputting a voltage V DET having a level in correspondence with a level of the output signal and a voltage to current converting circuit for converting the output voltage V DET from the rectifying circuit into a current. The voltage to current converting circuit is constituted to provide a differential amplifier supplied with the output voltage V DET from the rectifying circuit. A current I DET outputted by the differential amplifier is converted into AGC voltage V AGC by being supplied to a capacitor. By the AGC voltage V AGC, AGC is carried out by controlling the level of the input signal at the control circuit. By changing a magnitude of an operating current I CONT of the differential amplifier, an alternating current amplification factor of the differential amplifier is changed to thereby change the time constant of AGC.

6 Claims, 6 Drawing Sheets

AGC CIRCUIT

BACKGROUND OF THE INVENTION

1. Field of the Invention

The present invention relates to an AGC circuit preferably applied to a receiver of digital voice broadcast.

2. Description of the Related Art

Digitization of broadcasts have progressed and also a transmission system of the broadcast wave is being shifted from a conventional analog system such as AM or FM to a digital system. Particularly, in Europe, digital broadcast of voice programs has been started and as the digital voice broadcast, there is DAB (digital voice broadcast complying with Eureka147 standard).

According to DAB, by adopting OFDM as a modulation system having a transmission band of about 1.5 MHz and layer II of MPEG audio for data compression of an audio signal, a maximum of 64 sets of digital audio signals or digital data are simultaneously broadcast.

In this case, OFDM is a multiplex carrier system for carrying out broadcast by simultaneously transmitting a number of carriers. For example, according to a broadcast mode referred to as DAB mode II, 384 carrier signals are transmitted at intervals of 4 kHz within the above-described transmission band. Further, frequencies used in broadcast fall in a range of 170 MHz through 220 MHz and 1.4 GHz band.

In the meantime, according to a DAB receiver mounted on a moving body such as a car, an intensity of the radio wave is changed over time by fading and a state of the fading is changed by a moving speed of the moving body, a received frequency and so on. Therefore, in order to provide low bit error rate in the DAB receiver, an AGC circuit is needed and a time constant thereof needs to change into a pertinent value in correspondence with a situation of receiving the broadcast radio wave such as the radio wave intensity.

Further, capacitors for the time constant are externally attached to ICs for AGC and depending on the DAB receiver, the capacitors for the time constant are switched by a switching circuit in accordance with a situation of receiving the broadcast radio wave.

However, in this case, the time constant can only be changed in steps, further, the number of parts is increased.

SUMMARY OF THE INVENTION

The present invention intends to resolve such a problem.

According to the invention, there is provided an AGC circuit including a variable gain amplifier supplied with an input signal for controlling a gain thereof and outputting an output signal, a detecting circuit for detecting an output signal from the variable gain amplifier and outputting a voltage a level of which is changed in correspondence with a level of the output signal, a voltage to current converting circuit for converting an output voltage from the detecting circuit into a current, wherein the voltage to current converting circuit includes a differential amplifier to which the output voltage from the detecting circuit is supplied, wherein a current outputted from the differential amplifier is supplied to a capacitor to thereby convert the current into an AGC voltage, wherein AGC is carried out by controlling the gain of the variable gain amplifier by the AGC voltage, wherein a time constant of the AGC is changed by changing an alternating current amplification factor of the differential amplifier by changing a magnitude of an operating current of the differential amplifier.

Therefore, by changing the magnitude of the operating current of the differential amplifier, an output impedance of the differential amplifier is changed to thereby change the time constant of AGC.

DETAILED DESCRIPTION OF THE DRAWINGS

DETAILED DESCRIPTION OF THE PREFERRED EMBODIMENTS

Figure 1:
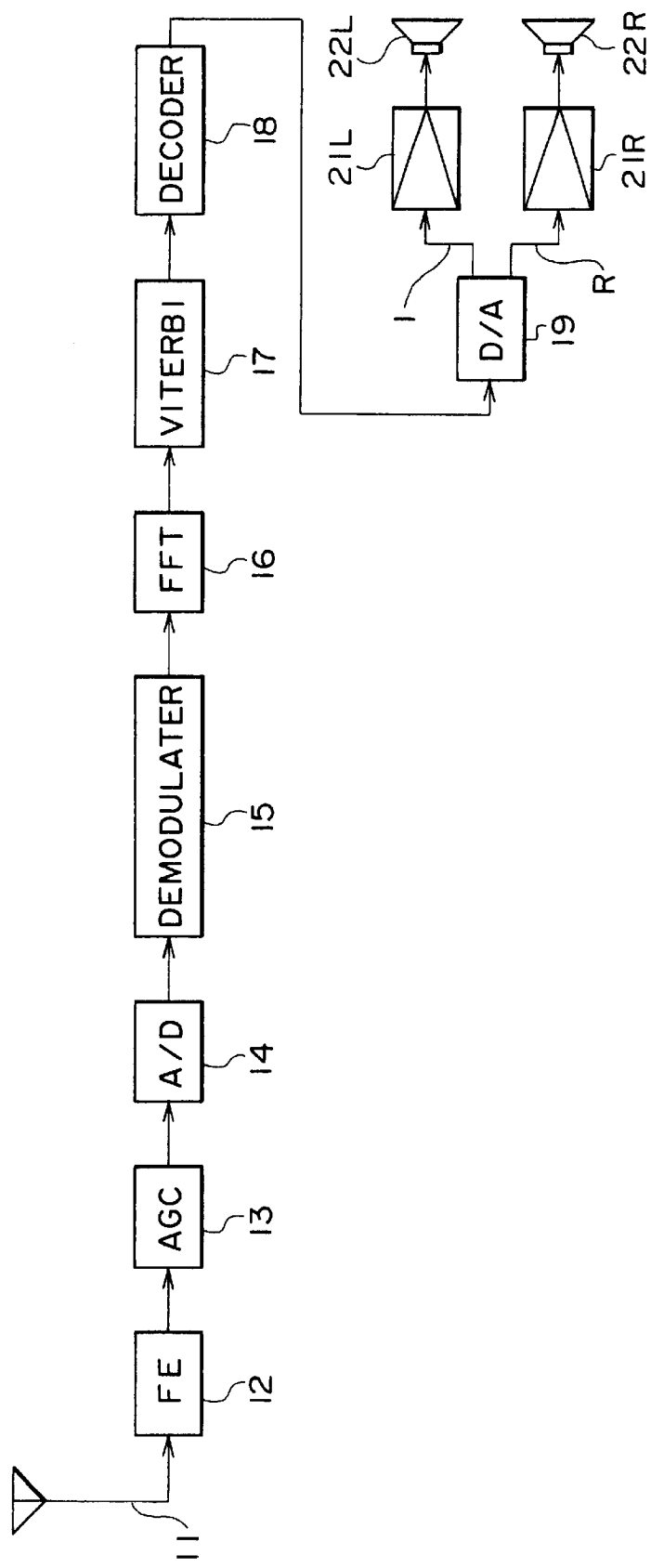
FIG. 1 is a system diagram showing an embodiment of the present invention.

In FIG. 1, a broadcast wave signal of DAB is received by an antenna 11 and the received signal is supplied to a front end circuit 12 constituted in a superheterodyne type and is converted into an intermediate frequency signal. A level of the intermediate frequency signal is generally about −60 dBm through 0 dBm and according to an A/D converter circuit at a later stage, about 1 $V_{p-p}$ is needed as an input level.

Hence, the intermediate frequency signal is supplied to an AGC amplifier 13 (details will be described later) and amplified to a signal having a necessary constant level regardless of a reception level and an output signal therefrom is supplied to an A/D converter circuit 14 and is A/D-converted into a digital signal.

Further, the digital signal is supplied to a quadrature demodulating circuit 15 where data of a same phase component (real axis component) and an orthogonal component (imaginary axis component) are demodulated, the data are subjected to complex Fourier transformation at an FFT circuit 16 to thereby output frequency components for respective symbols, the output is supplied to a Viterbi decoder circuit 17 where deinterleaving and error correction are carried out and digital audio data of an object program (service component) is selected.

Successively, the selected data is supplied to an audio decoder circuit 18 where a decode processing of MPEG data expansion or the like is carried out and the digital audio data of the object program is outputted from the decoder circuit 18. Further, the outputted digital audio data is supplied to a D/A converter circuit 19 and D/A-converted into analog audio signals L and R and the signals L and R are supplied to speakers 22L and 22R via amplifiers 21L and 21R.

Figure 2:
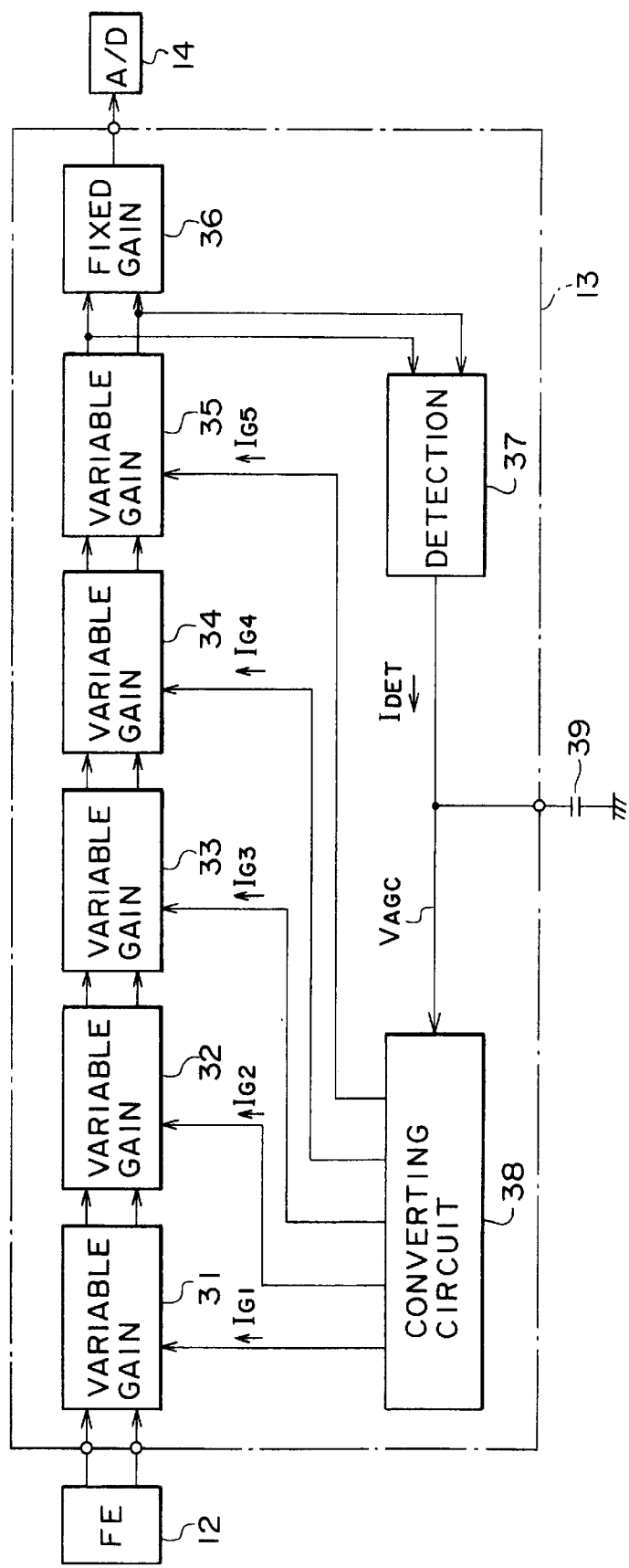
FIG. 2 is a system diagram showing an embodiment of a portion of FIG. 1.
Figure 3:
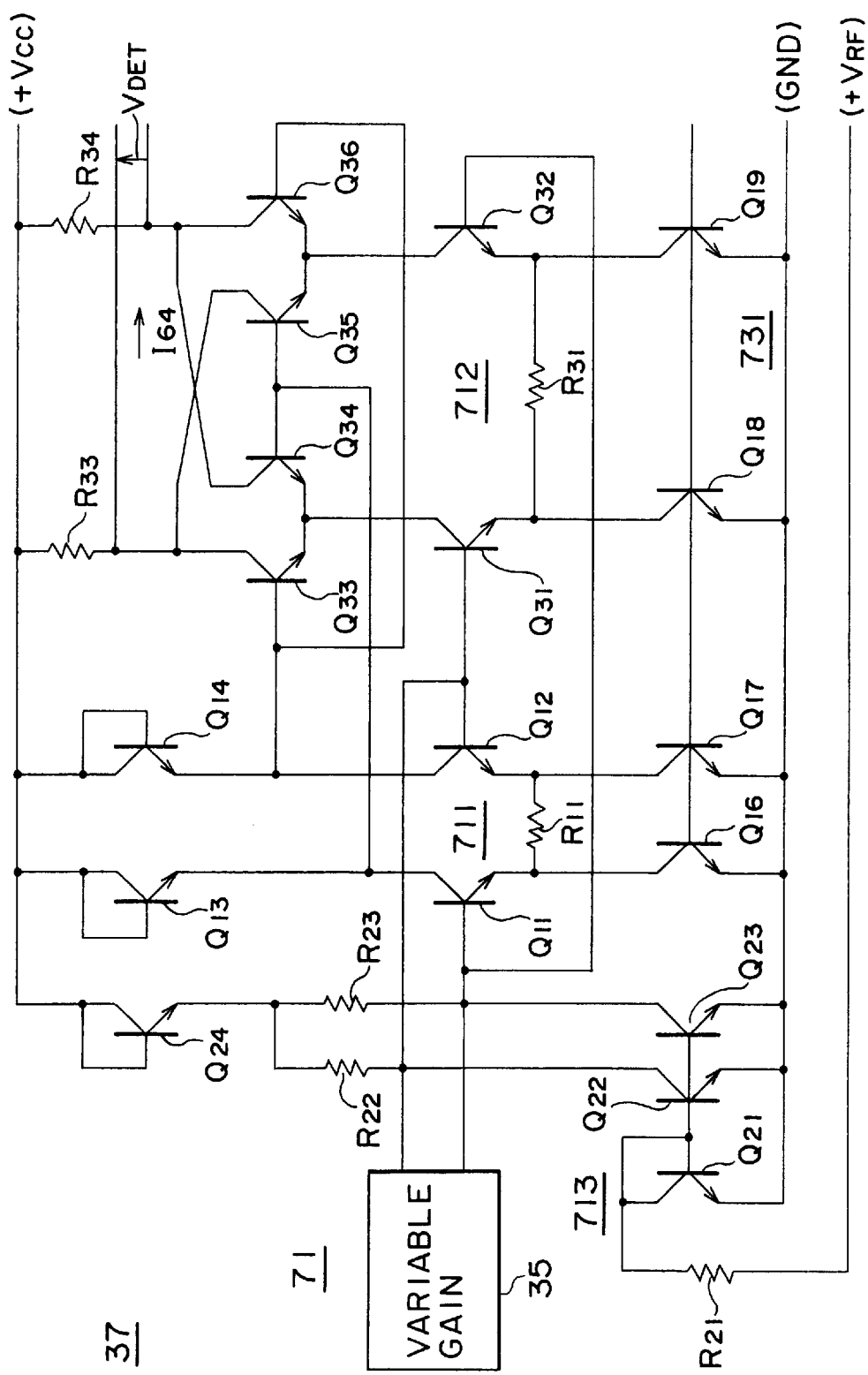
FIG. 3 is a connection diagram showing an embodiment of a portion of FIG. 2.
Figure 4:
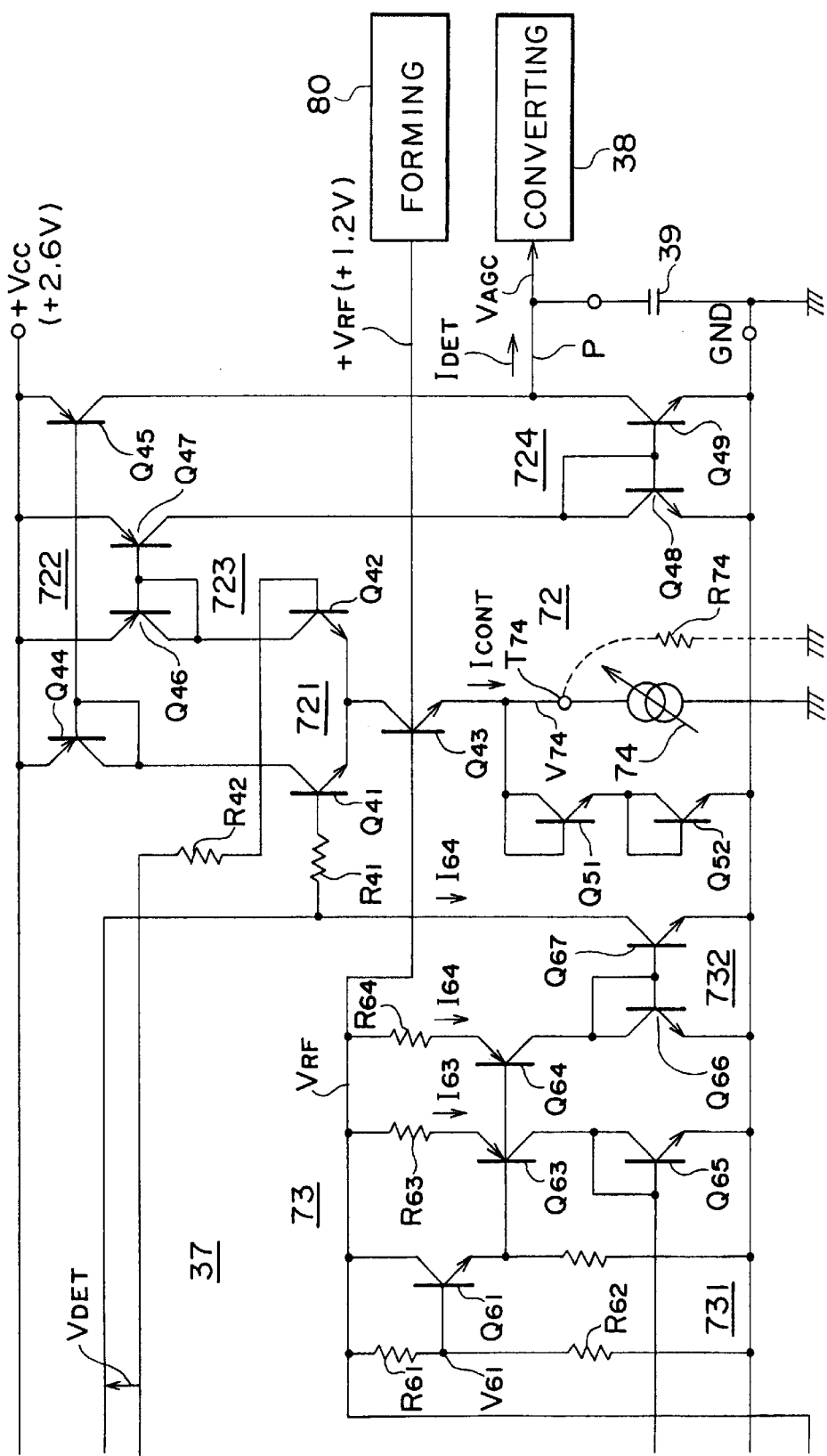
FIG. 4 is a connection diagram showing an embodiment of a portion of FIG. 2.
Figure 5:
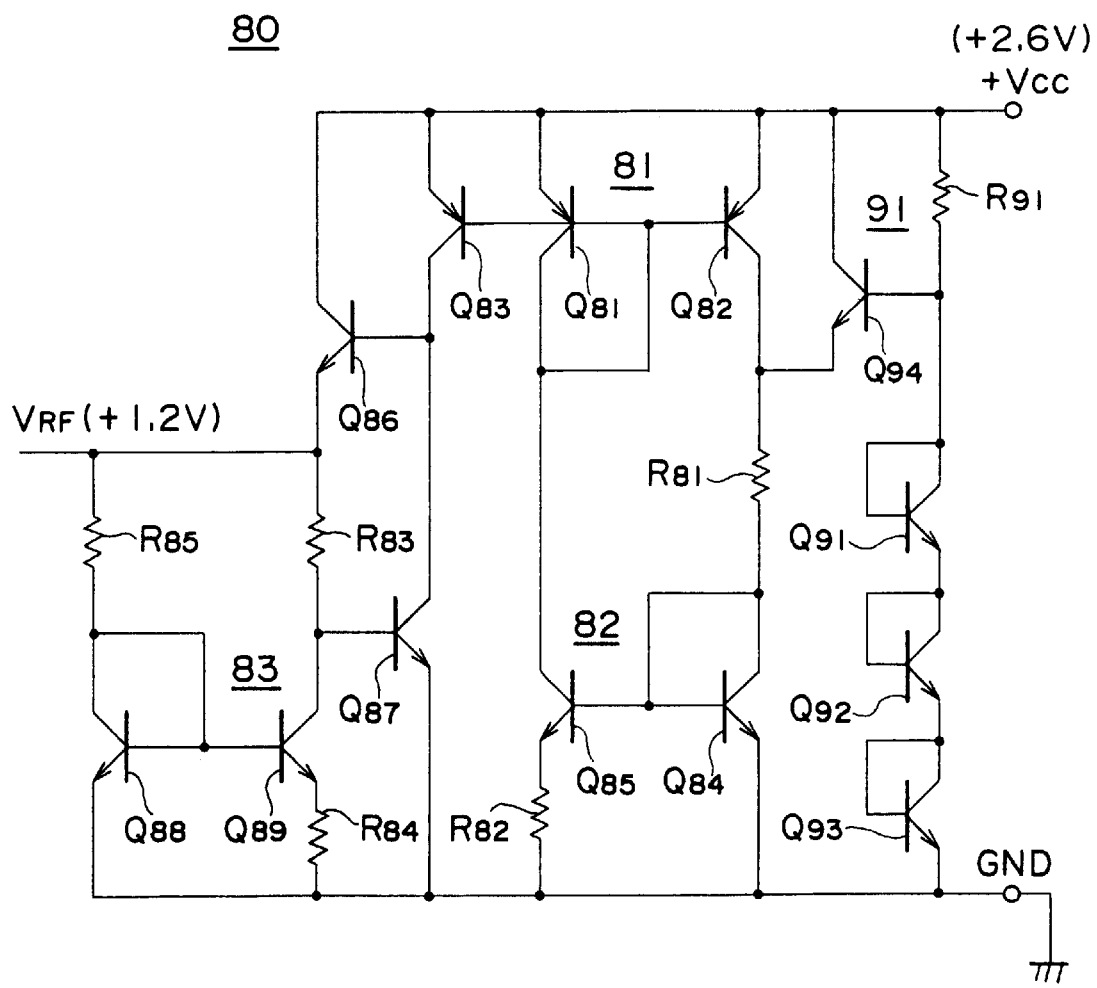
FIG. 5 is a connection diagram showing an embodiment of a portion of FIG. 4.

Further, according to the invention, the AGC amplifier 13 is constituted as shown by, for example, FIG. 2 through FIG. 5. Incidentally, FIG. 2 shows an outline of the AGC amplifier 13 and FIG. 3 through FIG. 5 show a specific constitution example of a circuit of forming an AGC voltage.

In FIG. 2, the AGC amplifier 13 is constituted by continuously connecting five of variable gain amplifiers 31 through 35 and an amplifier 36 having a fixed gain. Further, the intermediate frequency signal of a balance type is outputted from the front end circuit 12 and supplied to the variable gain amplifier 31 at an initial stage and the intermediate frequency signal which has been subjected to AGC amplification is outputted from the amplifier 36 at a final stage and is supplied to the A/D converter circuit 14. Further, the total maximum gain of the amplifiers 31 through 36 is set to, for example, about 60 dB.

Further, at this occasion, the intermediate frequency signal provided from the variable gain amplifier 35 is supplied to an AGC detecting circuit 37 from which a current I DET having a level changed in accordance with a level of the intermediate frequency signal is outputted.

Figure 6:
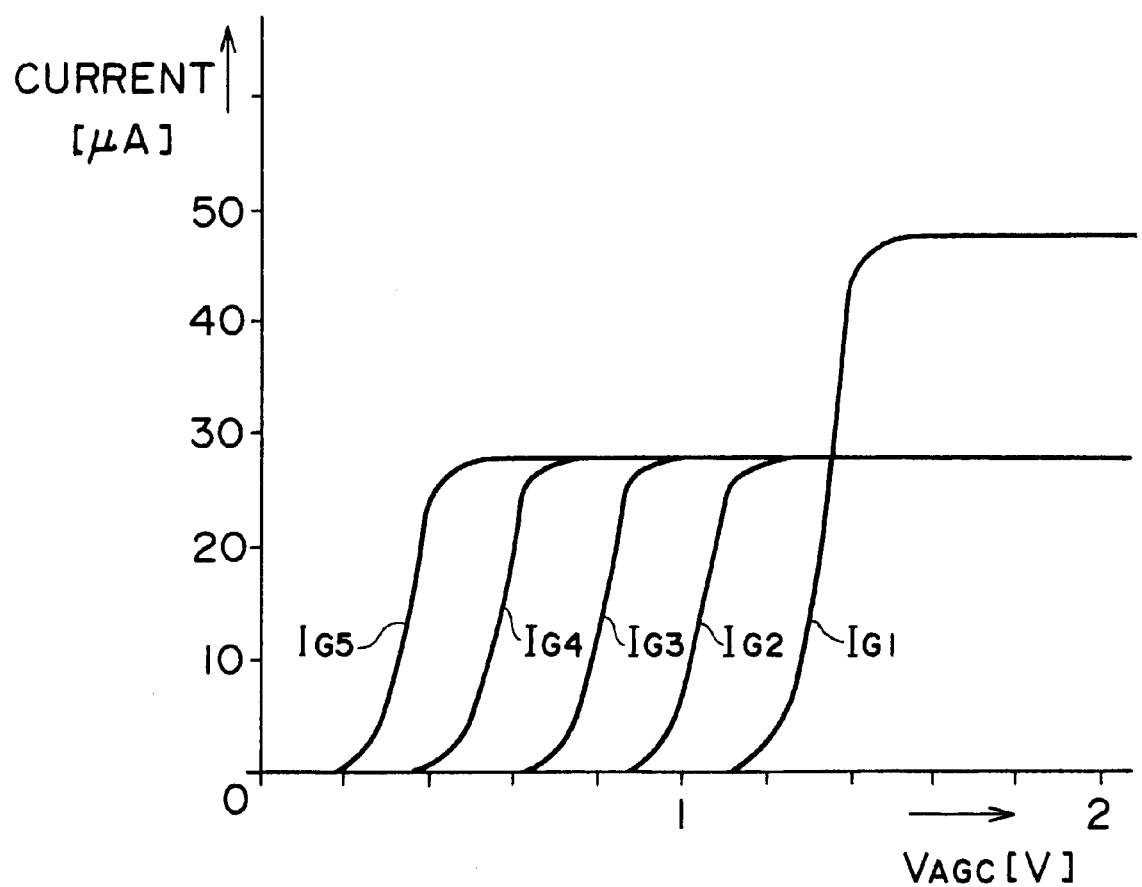
FIG. 6 is a characteristic diagram for explaining the present invention.

Further, a capacitor 39 is charged by the current I DET, an AGC voltage V AGC is formed and the AGC voltage is supplied to a control current forming circuit 38 by which there are formed control currents I G1 through I G5 having characteristics shown by, for example, FIG. 6. That is, the control currents I G1 through I G5 are currents which are changed in the form of an exponential function to certain ranges when the AGC voltage V AGC is elevated, and become constant in ranges larger than the certain ranges and in which rise points (points where currents start flowing) become higher in an order of the currents I G5 through I G1.

Further, the control currents I G1 through I G5 are supplied to the variable gain amplifiers 31 through 35 as control signals of gains thereof and the variable gain amplifiers 31 through 35 are controlled such that gains are reduced when the control currents I G1 through I G5 are increased. Further, the circuits 31 through 38 are formed in one chip IC as shown by broken lines surrounding thereof in FIG. 2.

The ACC detecting circuit 37 is constituted as shown by, for example, FIG. 3 and FIG. 4 and right side of a circuit of FIG. 3 continues to left side of a circuit of FIG. 4. Further, in the case of FIG. 3 and FIG. 4, the AC detecting circuit 37 is constituted by a rectifying circuit 71 for subjecting the intermediate frequency signal to both wave rectification, a voltage to current converting circuit 72 for converting a rectified output voltage therefrom into the control current I DET and outputting the control current and a current source circuit 73 providing an offset to rectified output voltage supplied from the rectifying circuit 71 to the voltage to current converting circuit 72.

Further, in FIG. 3, the rectifying circuit 71 is constituted by a multiplying circuit 712 of a double balance type and a differential amplifier 711 supplying the intermediate frequency signal thereto. That is, the intermediate frequency signal of the balance type is outputted from the variable gain amplifier 35 and the intermediate frequency signal is supplied to bases of transistors Q 11 and Q 12.

The transistors Q 11 and Q 12 constitute the differential amplifier 711, a resistor R 11 is connected between emitters thereof, the emitters are connected to collectors of transistors Q 16 and Q 17 for constant current supply source with a ground line as a reference potential point and collectors of the transistors Q 11 and Q 12 are connected to a power source line (power source voltage+V CC is, for example, 2.6 V) via transistors Q 13 and Q 14 which are connected into diodes.

Further, a transistor Q 24 connected into a diode, a resistor R 22 and a transistor Q 22 are connected in series between the power source line and the ground line and a resistor R 23 and a transistor Q 22 are connected in series between the transistor Q 24 and the ground line Further, points connecting the resistors R 22 and R 23 and transistors Q 22 and Q 23 are connected to the bases of the transistors Q 11 and Q 12.

Further, a current mirror circuit 713 is constituted by transistors Q 21 through Q 23 with the ground line as a reference potential point, constant voltage V RF having no temperature dependency is prepared, the voltage V RF is converted into current by a resistor R 21 and supplied to the transistor Q 21, predetermined collector currents are flowed to the transistors Q 22 and Q 23, as a result, a base bias voltage is supplied to the transistors Q 11 and Q 12.

Further, the voltage V RF is a voltage referred to as a band gap reference voltage or the like and the magnitude is about 1.2 V. Further, a description will be given later of a circuit for forming the voltage V RF.

In this way, the amplified intermediate frequency signal is outputted from the collectors of the transistors Q 11 and Q 12.

Further, the multiplying circuit 712 is constituted by transistors Q 31 through Q 36, Q 18 and Q 19. that is, the intermediate frequency signal from the variable gain amplifier 35 is supplied to bases of the transistors 31 and Q 32 and a resistor R 31 is connected between emitters thereof and the emitters are connected to collectors of the transistors Q 18 and Q 19 for a constant current supply source with the ground line as a reference potential point.

Further, a collector of the transistor Q 31 is connected to emitters of the transistors Q 33 and Q 34, a collector of the transistor Q 32 is connected to emitters of the transistors Q 35 and Q 36 and the collectors of the transistors Q 11 and Q 12 are connected to bases of the transistors Q 34, Q 35 and Q 33, Q 36. Further, collectors of the transistors Q 33, Q 35 and Q 34, Q 36 are connected to the power source line via resistors R 33 and R 34.

Accordingly, in the multiplying circuit 712, the intermediate frequency signal outputted from the variable gain amplifier 35 is multiplied by the intermediate frequency signals outputted from the collectors of the transistors Q 11 and Q 12 of the differential amplifier 711 and accordingly, a wave rectified voltage V DET a level of which is changed in correspondence with the level of the intermediate frequency signal is provided between the collectors of the transistors Q 33 and Q 35 and the collectors of the transistors Q 34 and Q 36. Further, in this case, the rectified voltage V DET is provided with a polarity in which the larger the level of the intermediate frequency signal, the higher the collector potentials of the transistors Q 33 and Q 35 than the collector potential of the transistors Q 34 and Q 36.

Further, the voltage to current converting circuit 72 is constituted by a differential amplifier 721 and current mirror circuits 722 through 724 in the case of FIG. 4. That is, emitters of transistors Q 41 and Q 42 are connected to an external connection terminal T 74 via a collector/emitter of a transistor Q 43 to thereby constitute the differential amplifier 721 and bases of the transistors Q 41 and Q 42 are connected to the collectors of the transistors Q 33, Q 35 and Q 34, Q 36 via resistors R 41 and R 42.

Further, the band gap difference voltage V RF is supplied to a base of the transistors Q 43 and transistors Q 51 and Q 52 which are connected into diodes are connected in series between an emitter thereof and the ground line. Further, a variable constant current supply source 74 is externally attached to the terminal T 74 as shown by a solid line.

Further, a collector of the transistor Q 41 is connected to a collector of a transistor Q 44, the current mirror circuit 722 is constituted by transistors Q 44 and Q 45 with the power source line as a reference potential point, a collector of the transistor Q 42 is connected to a collector of a transistor Q 46 and the current mirror circuit 723 is constituted by transistors Q 46 and Q 47 with the power source line as a reference potential point.

Further, a collector of the transistor Q 47 is connected to a collector of a transistor Q 48, the current mirror circuit 724 is constituted by transistors Q 48 and Q 49 with the ground line as a reference potential point and a collector of the transistor Q 49 is connected to a collector of the transistor Q 45.

Accordingly, the rectified voltage V DET from the rectifying circuit 71 is supplied to the differential amplifier 721, converted into a current, amplified and outputted from the collectors of the transistors Q 41 and Q 42.

Further, in this case, a collector current of the transistor Q 45 equals a collector current of the transistor Q 41 by the current mirror circuit 722. Further, a collector current of the transistor Q 49 equals a collector current of the transistor Q 47 by the current mirror circuit 724 and the collector current equals a collector current of the transistor Q 42 by the current mirror circuit 723.

Further, in the case of V DET =0, the collector current of the transistor Q 41 equals the collector current of the transistor Q 42 and accordingly, the collector current of the transistor Q 45 equals the collector current of the transistor Q 49, therefore, current does not flow out to a circuit at a later stage from a connection point P connecting the collectors of the transistor Q 45 and Q 49, conversely, current does not flow to the connection point P from a circuit at a later stage. That is, an output current I DET of the detecting circuit 37 is null.

However, when the voltage V DET is elevated, the collector current of the transistor Q 41 is increased and the collector current of the transistor Q 45 is increased, the collector current of the transistor Q 42 is reduced and the collector current of the transistor Q 49 is reduced and therefore, current of a difference between the collector current of the transistor Q 45 and the collector current of the transistor Q 49, flows out from the connection point P to a circuit at a later stage. That is, the current I DET is outputted.

Therefore, the current I DET having a magnitude in correspondence with the rectified voltage V DET is outputted from the connection point P. Further, as mentioned above, the capacitor 39 is charged by the current I DET and the AGC voltage V AGC is formed.

However, in the case of FIG. 4, an offset having a predetermined magnitude is provided to the rectified voltage V DET supplied from the rectifying circuit 71 to the voltage to current converting circuit 72 by the current source circuit 73 and when the level of the intermediate frequency signal becomes equal to or higher than a prescribed value, the control current I DET is outputted.

That is, the band gap reference voltage V RF is divided by resistors R 61 and R 62, a divided voltage V 61 thereof is supplied to bases of transistors Q 63 and Q 64 via a transistor Q 61 of an emitter follower and emitters of the transistors Q 63 and Q 64 are connected to a voltage line of the band gap reference voltage V RF via resistors R 63 and R 64.

Therefore, a potential point lower than that of a base of the transistor Q 61 by a base/emitter voltage V BE constitutes those of bases of the transistors Q 63 and Q 64, a potential point higher than the bases by the voltage V BE constitutes those of emitters of the transistors Q 63 and Q 64 and therefore, the base potential of the transistor Q 61 equals emitter potential of the transistors Q 63 and Q 64 and the emitter potential of the transistors Q 63 and Q 64 becomes the voltage V 61.

Therefore, a voltage of a difference between the voltage V RF and the voltage V 61 is applied to the resistors R 63 and R 64 and accordingly, currents I 63 and I 64, shown below, flow in the resistors R 63 and R 64.

$$I\ 63 = (V\ RF - V\ 61)/R\ 63$$

$$I\ 64 = (V\ RF - V\ 61)/R\ 64$$

Further, the current I 63 is supplied to a transistor Q 65 via the transistor Q 63 and by the transistor Q 65 and the transistors Q 16 through Q 19, a current mirror circuit 731 is constituted with the ground line as a reference potential point. Accordingly, the current I 63 flows to collectors of the transistors Q 16 through Q 19 and the transistors Q 16 through Q 19 operate as constant current supply sources.

Further, the current I 64 of the resistor R 64 is supplied to a transistor Q 66 via the transistor Q 64, by the transistor Q 66 and a transistor Q 67, a current mirror circuit 732 with the ground line as a reference potential point is constituted and a collector of the transistor Q 67 is connected to a connection point connecting the collectors of the transistors Q 33 and Q 35 and the resistor R 41.

Accordingly, the current I 64 flows to the collector of the transistor Q 67, the current I 64 flows to the resistor R 33 and accordingly, a voltage drop having a magnitude shown below is caused in the resistor R 33 by the current I 64.

$$\Delta V = R\ 33 \cdot I\ 64$$

Therefore, when there is no intermediate frequency signal (no signal), the collector potential of the transistors Q 33 and Q 35 is lower than the collector potential of the transistors Q 34 and Q 36 by a voltage $\Delta V$ and accordingly, the base potential of the transistor Q 41 is lower than the base potential of the transistor Q 42 by the voltage $\Delta V$.

Further, in this situation, the collector potential of the transistor Q 41 is smaller than the collector current of the transistor Q 42 and accordingly, the collector current of the transistor Q 45 becomes smaller than the collector current of the transistor Q 49, as a result, the control current I DET does not flow.

However, when the level of the intermediate frequency signal is elevated, the voltage V DET is elevated in accordance therewith as described above and when the voltage V DET is elevated to a certain level, an amount of elevating the voltage V DET by elevating the level of the intermediate frequency signal, is precisely canceled by the voltage $\Delta V$ and V DET=0 is established. Further, when the level of the intermediate frequency signal is further elevated, thereafter, the voltage V DET is also elevated in correspondence with elevation of the level and the control current I DET having a magnitude in correspondence with the level of the voltage V DET flows.

Therefore, the rectified voltage V DET is provided with an of f set having a value of V by the current source circuit 73 and when the level of the intermediate frequency signal becomes equal to or higher than the prescribed value, V DET>0 is established and the control current I DET is outputted.

Generally, when, in a transistor, notation V BE designates a base/emitter voltage of the transistor and notation IC designates a collector current, the following equation is established.

$$IC = IS \cdot \exp\ (V\ BE/V\ T)$$

where notation IS designates a saturated current, V T=kT/q≈26 mV, notation k designates Boltzman's constant, notation T designates absolute temperature and notation q designates Coulomb amount.

Further, when notation v be designates an alternating current component of the base/emitter voltage V BE and notation ic designates an alternating current component of the collector current IC, an alternating current amplification factor gm is as shown below.

$$gm = ic/v\,be$$

Accordingly, when calculated by differentiation, the following equation is established.

$$gm = d(IC)/d\,(V\,BE)$$
$$= (1/V\,T)\cdot I\,S\cdot\exp\,(V\,BE/V\,T)$$
$$= (1/V\,T)\cdot IC$$
$$= IC/V\,T$$

Therefore, the following relationship is established.

$$ic/v\,be = IC/V\,T$$

Or, the following relationship is established.

$$v\,be/ic = V\,T/IC \qquad (1)$$

Accordingly, in the voltage to current converting circuit 72, when notation v det designates an alternating current component of the input voltage (detecting voltage) V DET and notation I CONT designates constant current of the constant current source 74, in the transistors Q 41 and Q 42, the following equation is established from Equation (1).

$$v\,det/i\,det = V\,T/(I\,CONT/2)$$
$$= 2\cdot V\,T/I\,CONT \qquad (2)$$

Further, time constant of the AGC loop in the AGC amplifier 13 is determined by the output impedance of the voltage to current converting circuit 72 and a capacitance C 39 of the capacitor 39 as follows.

$$\tau = (v\,det/i\,det)\cdot C\,39$$

Further, when Equation (2) is substituted for the above equation, the following equation is established.

$$\tau = 2\cdot V\,T/I\,CONT\cdot C\,39 \qquad (3)$$

Therefore, when a magnitude of the constant current I CONT is changed, the time constant τ is changed. For example, when I CONT=0, the time constant τ can be made infinitive and the AGC voltage V AGC can be held.

Accordingly, when the magnitude of the output current I CONT of the variable constant current source 74 is changed by a system control circuit (not illustrated) in accordance with a situation of receiving broadcast radio wave of DAB, there can be provided time constant of AGC optimum to the received situation.

Further, at this occasion, the magnitude of the current I CONT can be changed smoothly in principle and in an actual circuit, the magnitude can be changed over 16 stages when it is changed in accordance with data of 4 bits, for example.

In the meantime, in the case of a DAB receiver of a stationary type used in a household or the like, the situation of receiving DAB stays constant and therefore, there is no need of changing the time constant of AGC and in that case, as shown by a broken line in FIG. 4, a resistor R 74 may be connected to the terminal T 74.

That is, in this way a terminal voltage V 74 of the resistor R 74 becomes as follows.

$$V\,74 = I\,CONT\cdot R\,74$$

In such a case, the following relationship is established in the transistor Q 43.

$$V\,RF = V\,BE + V\,74$$

Therefore, from both equations, the following relationship is established.

$$V\,RF = V\,BE + I\,CONT\cdot R\,74$$

and accordingly, the following equation is established.

$$I\,CONT = (V\,RF - V\,BE)/R\,74 \qquad (4)$$

Further, the band gap reference voltage V RF is a voltage having a temperature coefficient substantially equal to null and this is formed by adding a voltage (=V BE) having a negative temperature coefficient provided by PN junction and a voltage n times as much as voltage V T having a positive temperature coefficient as follows.

$$V\,RF = V\,BE + n\cdot V\,T$$

Accordingly, the equation is substituted for Equation (4) as follows.

$$I\,CONT = \{(V\,BE + n\cdot V\,T) - V\,BE\}/R\,74$$
$$= n\cdot V\,T/R\,74$$

Accordingly, the time constant at this occasion is expressed by the following equation by substituting the above equation for Equation (3).

$$\tau = 2\cdot V\,T/I\,CONT\cdot C\,39$$
$$= 2\cdot V\,T/(n\cdot V\,T/R\,74)\cdot C\,39$$
$$= 2\cdot R\,74\cdot C\,39/n$$

Therefore, when the resistor R 74 having the temperature coefficient of 0 is used, temperature dependency of the time constant of AGC can be avoided.

That is, in converting the detected voltage V DET into the current I DET in the voltage to current converting circuit 72, even when the alternating current amplification factor gm of the transistors Q 41 and Q 42 of the differential amplifier 721 is provided with temperature dependency, the time constant τ can avoid having the temperature dependency.

Further, when the terminal T 74 is brought into an opened state, the gain of the AGC amplifiers 13 can be made constant by cutting the AGC loop.

The band gap reference voltage V RF can be formed by a forming circuit 80 shown by, for example, FIG. 5.

That is, a current mirror circuit 81 is constituted by transistors Q 81 through Q 83 with the power source line as a reference potential point and a collector of the transistor Q 82 on the output side is connected to a collector of a transistor Q 84 via a resistor R 81. The transistor Q 84 constitutes a current mirror circuit 82 with the ground line as a reference potential point along with a transistor Q 85 and an emitter resistor R 82 and a collector of the transistor Q 85 on the output side is connected to a collector of the transistor Q 81.

Further, a collector of the transistor Q 83 is connected to a base of a transistor Q 86, a collector of the transistor Q 86 is connected to a power source line, an emitter thereof is connected to a base of a transistor Q 87 via a resistor R 83, an emitter of the transistor Q 87 is connected to the ground line and a collector thereof is connected to the collector of the transistor Q 83.

Further, a current mirror circuit 83 with the ground line as a reference potential point is constituted by transistors Q 88 and Q 89 and an emitter resistor R 84, a collector of the transistor Q 88 on the input side is connected to the emitter of the transistor Q 86 via a resistor R 85 and a collector of the transistor Q 89 is connected to the base of the transistor Q 87.

Further, there is installed a starting circuit 91 for starting up the forming circuit 80 when a power source is made ON. That is, a series circuit of a resistor R 91 and transistors Q 91 through Q 93 which are connected into diodes, is connected between the power source line and the ground line, a point of connecting the resistor R 91 and the transistor Q 91 is connected to a base of a transistor Q 94, a collector thereof is connected to the power source line and an emitter thereof is connected to the collector of the transistor Q 82 Further, a joint area between the base and the emitter of the transistor Q 85 is made four times as much as that of the transistor Q 84 and a joint area between the base and the emitter of the transistor Q 89 is made four times as much as that of the transistor Q 88. Further, values of the resistors R 82 and R 84 are made equal to each other and values of the resistors R 83 and R 85 are made equal to each other.

According to such a constitution, when the power source is made ON, a voltage drop is caused in the series circuit of the transistors Q 91 through Q 93 and at this occasion, the transistor Q 82 stays OFF and therefore, the voltage drop is supplied to a series circuit of base/emitter of the transistor Q 94, the resistor R 81 and base/emitter of the transistor Q 84, the transistor Q 94 is made ON and the transistor Q 84 is made ON.

Therefore, a collector current having a predetermined magnitude is flowed to the transistor Q 85 and the collector current flows also to the collector of the transistor Q 81 and therefore, a collector current having a predetermined magnitude is flowed also to the transistor Q 82 and the collector current is flowed to the collector of the transistor Q 84 via the resistor R 81. Accordingly, thereafter, a current having a magnitude determined by the resistors R 81 and R 82 continues flowing in the transistors Q 84, Q 85, Q 81 and Q 82.

Further, at this occasion, a collector current having a magnitude equal to that of the collector current of the transistor Q 82 flows in the transistor Q 83, a portion of the collector current is supplied to the transistor Q 86 as a base current thereof and therefore, the transistor Q 86 is also made ON. Further, when the transistor Q 86 is made ON, the transistors Q 88 and Q 89 are also made ON and the transistor Q 87 is also made ON.

In this way, when the power source is made ON, the transistors Q 81 through Q 89 are brought into a steady state. Further, under the steady state, an emitter potential of the transistor Q 94 is elevated by voltage drop of the resistor R 81, the transistor Q 94 is biased reversely, thereafter, the transistor Q 94 is made OFF.

Further, under the steady state, when the collector current of the transistor Q 82 is, for example, increased by some reason, the voltage drop at the resistor R 81 is increased, the base/emitter voltage of the transistor Q 85 is reduced, as a result, the collector current of the transistor Q 85 is reduced, the collector current of the transistor Q 81 is also reduced and the collector current of the transistor Q 82 is also reduced. Therefore, the collector current of the transistor Q 82 is maintained at a predetermined constant magnitude.

Further, at this occasion, the collector current of the transistor Q 83 is also maintained at a constant magnitude and current of a difference between current flowing out of the collector of the transistor Q 83 and current flowing into the collector of the transistor Q 87, flows to the base of the transistor Q 86.

Further, in this case, when the emitter voltage of the transistor Q 86 is, for example, elevated, the base voltage of the transistor Q 87 is also elevated, as a result, the base current of the transistor Q 86 is reduced and accordingly, the emitter voltage of the transistor Q 86 is lowered. Therefore, emitter voltage of the transistor Q 86 is maintained at a predetermined constant magnitude.

Further, the emitter voltage is voltage of a sum of terminal voltage of the resistor R 83 and the base/emitter voltage of the transistor Q 87 and accordingly, by setting a value of the resistor R 83, desired voltage can be constituted. Then, the emitter voltage is outputted as the band gap reference voltage V RF and is used in the AGC detecting circuit 37 (as well as other circuits) as mentioned above.

As described above, the circuit 13 is operated as the AGC amplifier, in that case, by changing the magnitude of the constant current I CONT of the constant current source 74, the time constant τ of AGC can continuously be changed and accordingly, there can be constituted the time constant of AGC which is optimized in accordance with the situation of receiving broadcast radio wave of DAB.

Further, even with the same IC, when the resistor R 74 is connected to the terminal T 74, the time constant of AGC can be fixed. Further, the same terminal T 74 is used as the input terminal of the control current I CONT when the time constant is changed and is used as the terminal for connecting the resistor R 74 when the time constant is fixed and accordingly, a number of external connection terminals of IC can be reduced.

Further, when the time constant is fixed by connecting the resistor R 74, the time constant can be made to be accompanied by no temperature dependency.

Further, when the terminal T 74 is brought into an opened state, the gain of the AGC amplifier 13 can be made constant by cutting the AGC loop.

According to the present invention, the time constant of AGC can continuously be changed and accordingly, there can be constituted the time constant of AGC which is optimized in accordance with the situation of receiving broadcast radio wave of DAB. Further, even with the same IC, the time constant of AGC can also be fixed. Further, a number of external connection terminals of IC can be reduced. Further, when the time constant of AGC is fixed, the time constant can be made to be accompanied by no temperature dependency. Further, the gain of the AGC amplifier can also be fixed.

What is claimed is:

1. An automatic gain control (AGC) circuit comprising:

a variable gain amplifier supplied with an input signal for controlling a gain thereof and outputting an output signal;

a detecting circuit for detecting the output signal from the variable gain amplifier and outputting a voltage having a level changed in correspondence with a level of the output signal from the variable gain amplifier; and a voltage to current converting circuit for converting the voltage output from the detecting circuit into a current, wherein the voltage to current converting circuit includes a differential amplifier to which the voltage output from the detecting circuit is supplied, wherein a current output from the differential amplifier is supplied to a capacitor to thereby convert the current into an AGC voltage, wherein AGC is carried out by controlling the gain of the variable gain amplifier by the AGC voltage, and wherein a time constant of the AGC circuit is changed by changing an alternating current amplification factor of the differential amplifier by changing a magnitude of an operating current of the differential amplifier.

2. The AGC circuit according to claim 1, further comprising:

a current source circuit, wherein an offset having a predetermined magnitude is provided to the voltage output from the detecting circuit supplied to the differential amplifier by an output current from the current source circuit.

3. The AGC circuit according to claim 1:

wherein the differential amplifier comprises:
a pair of transistors; and
a third transistor forming a constant current supply source having a collector connected to both emitters of the pair of transistors,
wherein the output voltage from the detecting circuit is supplied to both bases of the pair of transistors,
wherein a current output from the pair of transistors is subjected to current to voltage conversion into the AGC voltage by the capacitor,
wherein a predetermined constant voltage is supplied to a base of the third transistor forming the constant current supply source, and
wherein a control current for changing the time constant is supplied to an emitter of the third transistor forming the constant current supply source.

4. The AGC circuit according to claim 3, further comprising:

a current source circuit, wherein an offset having a predetermined magnitude is provided to the voltage output from the detecting circuit supplied to the differential amplifier by an output current from the current source circuit.

5. The AGC circuit according to claim 3:

wherein the AGC circuit is formed by ICs except the capacitor and the emitter of the third transistor forming the constant current supply source is connected to an external connection terminal.

6. The AGC circuit according to claim 5, further comprising:

a current source circuit, wherein an offset having a predetermined magnitude is provided to the voltage output from the detecting circuit supplied to the differential amplifier by an output current from the current source circuit.

* * * * *